United States Patent [19]

Kimura

[11] Patent Number: 5,663,594
[45] Date of Patent: Sep. 2, 1997

[54] BALL GRID ARRAY TYPE OF SEMICONDUCTOR DEVICE

[75] Inventor: Naoto Kimura, Kumamoto, Japan

[73] Assignee: NEC Corporation, Japan

[21] Appl. No.: 558,804

[22] Filed: Nov. 15, 1995

[30] Foreign Application Priority Data

Nov. 22, 1994 [JP] Japan ................... 6-287717

[51] Int. Cl.[6] .................................. H01L 23/495
[52] U.S. Cl. ................... 257/666; 257/676; 257/737; 257/738; 257/778
[58] Field of Search ................... 257/666, 738, 257/778, 737, 676

[56] References Cited

U.S. PATENT DOCUMENTS

| | | | |
|---|---|---|---|
| 4,937,656 | 6/1990 | Kohara | 257/676 |
| 5,216,278 | 6/1993 | Lin et al. | 257/688 |
| 5,293,072 | 3/1994 | Tsuji et al. | 257/737 |

*Primary Examiner*—Tom Thomas
*Assistant Examiner*—Roy Potter
*Attorney, Agent, or Firm*—Hayes, Soloway, Hennessey, Grossman & Hage, P.C.

[57] ABSTRACT

A ball grid type of semiconductor device is provided which includes a semiconductor chip having a plurality of electrode pads. In one preferred embodiment, the semiconductor chip is adhered to a plurality of corresponding planar metal leads via an insulator. The plurality of electrode pads and the plurality of corresponding metal leads are bonded by wires. The semiconductor chip and the plurality of metal leads are sealed together with the wires with a material. A predetermined number of holes passing through the seal to the plurality of metal leads are formed by a laser beam or a drill. Then, solder balls are melted to connect each of the solder balls to a corresponding one of the plurality of metal leads. Finally, the plurality of metal leads are cut at the outer surface of the seal.

10 Claims, 3 Drawing Sheets

BALL GRID ARRAY TYPE OF SEMICONDUCTOR DEVICE

BACKGROUND OF THE INVENTION

1. Field of the Invention

The present invention relates to a ball grid array type of semiconductor device, and more particularly, to a ball grid array type of semiconductor device in which solder balls are directly connected to a metal lead frame which is used in a plastic package.

2. Description of Related Art

Recently, semiconductor devices have been used in various application fields such as the industrial appliance field and consumer appliance field as integration has increased.

One package type semiconductor device is a ball grid type of semiconductor device. This type of semiconductor device is disclosed in, for example, U.S. Pat. No. 5,216,278. FIG. 1 shows a cross sectional view of the semiconductor package. Referring to FIG. 1, a semiconductor chip 101 having a plurality of electrode pads 102 is mounted on a substrate 111 made of, for example, epoxy resin with a silver paste. A plurality of wiring layer patterns 113 formed of copper foil with a predetermined pitch are provided around the semiconductor chip 101 on the front and rear surfaces of the substrate 111. The one end of the wiring layer pattern 113 on the front surface side is provided with an electrode pad 112 which is connected to the corresponding electrode pad 102 on the semiconductor chip 101 by a wire 103. The other end of the wiring layer pattern 113 on the front surface side is connected to the wiring layer pattern 113 on the rear surface side Via a through-hole 116. All the components mentioned above are sealed by resin on the front side of the substrate 111. A solder ball 106 is adhered to a solder pad 114 on the wiring layer pattern 113 on the rear surface side by a reflow process.

A method of manufacturing this conventional ball grid array type of semiconductor device will be described below. First, the semiconductor chip 101 is adhered to the resin substrate 111 made of glass epoxy resin by adhesive such as a silver paste. Then, the electrode pads 102 of the semiconductor chip 101 and the corresponding electrode pads 112 of the substrate 111 are connected by the wires 103 through bonding connection, respectively.

Next, a solder mask 115 is provided on the rear surface of the resin substrate 111 and solder balls 116 are melted and connected to solder pads 114 through openings located at predetermined positions. The solder ball 106 and the electrode pad 102 on the semiconductor chip 101 are connected via the solder pad 114, the wiring layer pattern 113 on the rear side, the through-hole 116, the electrode pad 112 on the wiring layer pattern 113 of the front side, and the wire 103.

In this manner, in the conventional ball grid array type of semiconductor device, there are required the space for the electrode pad 112 and through-hole 116, and the wiring layer pattern 113 on the substrate 111 around the semiconductor chip 101 and the steps for forming them. For this reason, manufacturing costs for this conventional type of ball grid array semiconductor device including material cost, process cost, and assembly cost is increased.

SUMMARY OF THE INVENTION

The present invention has, as an object, to provide a ball grid array type of semiconductor device which can be manufactured with low cost.

Another object of the present invention is to provide a ball grid array type of semiconductor device in which metal leads are used as a substrate in place of an insulative plate.

Further another object of the present invention is to provide a method of manufacturing a ball grid array type of semiconductor device as described above.

In order to achieve an aspect of the present invention, a ball grid type of semiconductor device includes a semiconductor chip having a plurality of electrode pads, and a plurality of electrically conductive leads, wherein the semiconductor chip is mounted on the plurality of leads such that the semiconductor chip is electrically isolated from the plurality of leads, and wherein each pad of the plurality of electrode pads of the semiconductor chip is connected to a corresponding one of the plurality of leads by a respective electrically conductive wire, and solder balls electrically conductively connected to the plurality of leads. The semiconductor device further includes a seal member for sealing the plurality of leads and the semiconductor chip together with the wires such that the seal member has holes for the solder balls. The seal member is composed of a thermosetting resin.

In this case, it is desirable that the plurality of leads are substantially parallel to each other, and have a predetermined spacing in a direction between two adjacent two leads. The plurality of leads may be formed such that the plurality of leads substantially obliquely intersect the peripheral portion of the semiconductor chip. Alternatively, the plurality of leads may be formed such that the plurality of leads substantially perpendicularly intersect the peripheral portion of the semiconductor chip.

In order to achieve another aspect of the present invention, in a method of manufacturing a ball grid type of semiconductor device, a semiconductor chip having a plurality of electrode pads and a plurality of metal leads are provided such that the semiconductor chip and the plurality of metal leads are electrically isolated. The plurality of electrode pads and the plurality of corresponding metal leads are bonded by wires and sealed together with the wires. After a predetermined number of holes are formed so as to pass through the seal to the plurality of metal leads, solder balls are melted to connect each of the solder balls to a corresponding one of the plurality of metal leads through the holes.

In this case, the entirety of each of the plurality of metal leads may be sealed or a part of each of the plurality of metal leads may be sealed by, for example, thermosetting resin. In the case of sealing parts of metal leads, the plurality of metal leads are cut at a predetermined distance from the outer surface of the seal such that the semiconductor device has protruding lead portions. After the semiconductor device is tested using the protruding lead portions, the protruding lead portions are cut.

In order to form the holes for the solder balls, a package is formed with resin such that the package has concave portions at positions corresponding to the holes and then the holes are formed by either using a laser beam, a mechanical means or chemical means to reach the plurality of metal leads.

The plurality of metal leads are formed sa as to be substantially parallel to each other and adjacent ones of the plurality of metal leads are provided with the same spacing in a direction. In addition, the plurality of metal leads may be provided such that the plurality of metal leads substantially obliquely intersect the peripheral portion of the semiconductor chip or such that the plurality of metal leads substantially perpendicularly intersect the peripheral portion of the semiconductor chip.

BRIEF DESCRIPTION OF THE DRAWINGS

FIGS. 3A to 3D are diagrams for explaining the manufacturing process of the semiconductor device, wherein FIGS. 3A and 3B are perspective views and FIGS. 3C and 3D are cross sectional views.

DESCRIPTION OF THE PREFERRED EMBODIMENTS

A ball grid array type of semiconductor device according to the present invention will be described below in detail with reference to the accompanying drawings.

Figure 1:
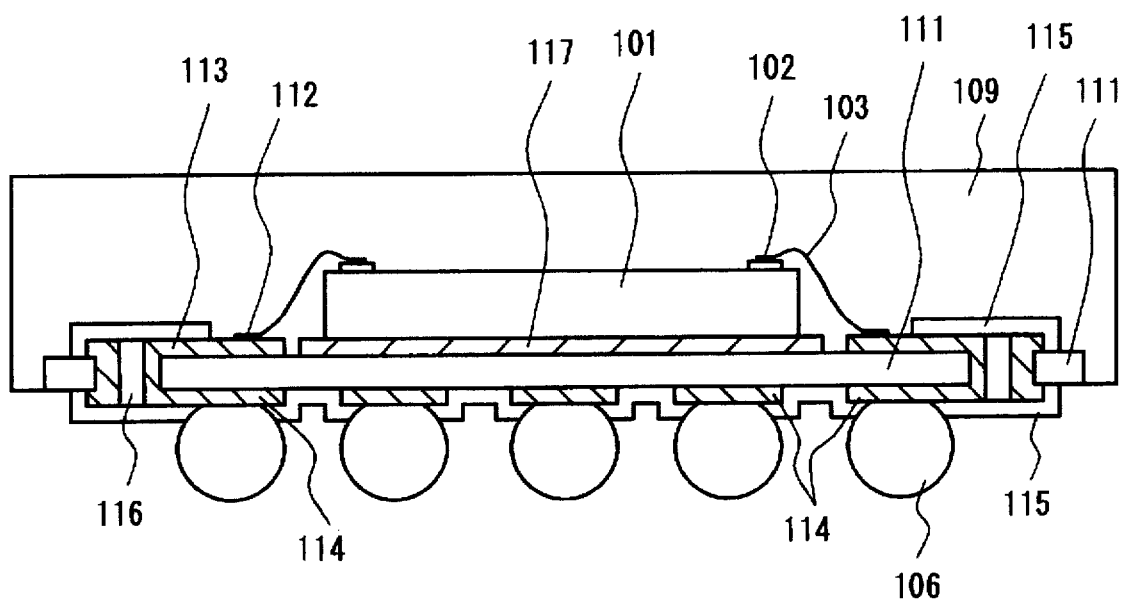
FIG. 1 is a cross sectional view of a conventional ball grid array type of semiconductor device.
Figure 2:
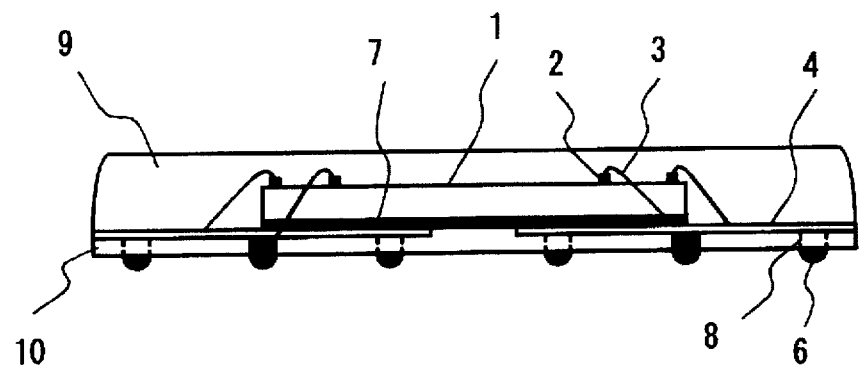
FIG. 2 is a cross sectional view of a ball grid array type of semiconductor device according to an embodiment of the present invention.

First, the structure of the ball grid type of semiconductor device will be described. FIG. 2 is a cross sectional view of the ball grid array type of semiconductor device according to an embodiment of the present invention. Referring to FIG. 2, the ball grid array type of semiconductor includes a plurality of metal leads 4, a semiconductor chip 1 mounted on the metal leads 4 via an insulating tape 7, bonding wires 3 connected between the electrode pads 2 provided on the semiconductor chip 1 and the metal leads 4, respectively. The above components are sealed by thermosetting resin using a low pressure transfer mold method with an epoxy pellet to form upper and lower seal sections 9 and 10. The ball grid array type of semiconductor device further includes solder balls 8 in electrically conductive contact with the metal leads 4 in holes 8.

Figure 4:
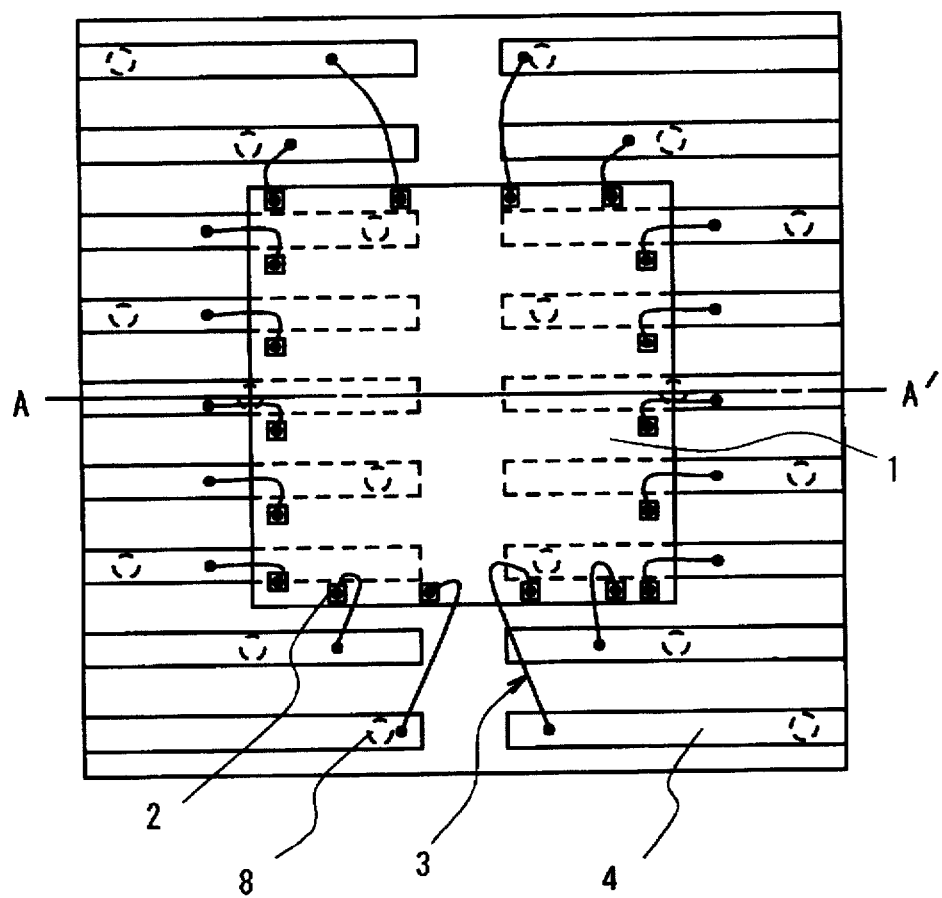
FIG. 4 is a diagram showing the relation of a lead frame and a semiconductor chip mounted thereon.

A metal lead frame 5 used in a plastic package is used for the metal inner leads 4. The metal lead frame 5 has leads 4 which protrude perpendicularly from the left- and right-hand sides of the frame 5, and extend in parallel to each other with a predetermined pitch, as shown in FIG. 4. Since the metal inner leads are provided in parallel with the same pitch, the manufacturing process can be simplified. The width of each lead 4 may be the same or different. However, the metal inner leads 4 may obliquely protrude in parallel with the same pitch from the left- and right-hand side of the frame 5 in such a manner that the leads 4 substantially obliquely intersect the semiconductor chip 1. In this case, the number of leads 4 could be increased while the pitch between the leads 4 is kept had the same value as in the above case.

The holes 8 passing through the lower seal section 10 to the metal leads 4 are provided on the rear side of the semiconductor device as follows. That is, one hole 8 is provided for every three metal leads 4 on the left-hand side of the uppermost of the three metal leads, i.e., the first lead, fourth lead, seventh lead, etc. One hole 8 is provided for every three metal leads 4 on the central position of the middle of the three metal leads, i.e., the second lead, fifth lead, eighth lead, etc. Further, one hole 8 is provided for every three metal leads 4 on the right-hand side of the lowermost of the three metal leads, the third lead, sixth lead, ninth lead, etc. Thus, the holes are preferably provided with a pitch of 100 μm or more. In this embodiment, the pitch between the holes is about 1.5 mm.

Figure 3A:
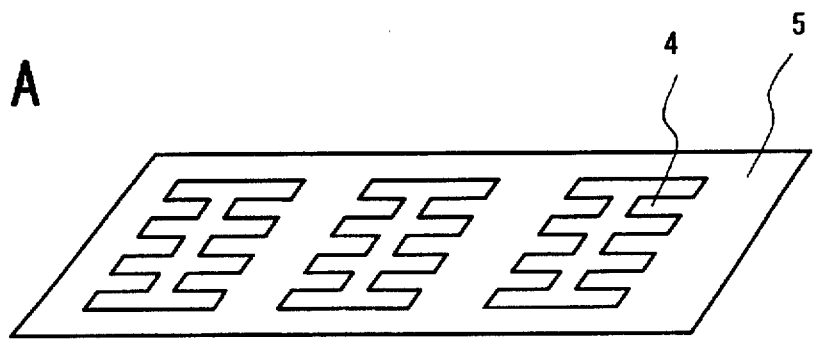
Figure 3B:
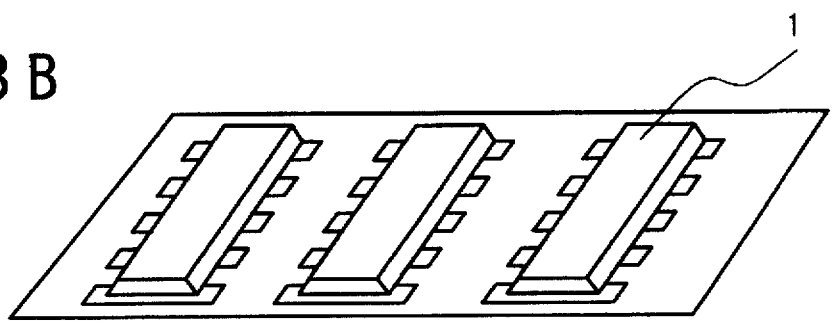

Next, a method of manufacturing the ball grid array type of semiconductor device will be described below with reference to FIGS. 3A to 3D. First, as shown in FIG. 3A, a metal lead frame 5 is prepared. Subsequently, as shown in FIG. 3B, the semiconductor chip 1 is mounted on the metal inner leads 4 via an insulative material such as a non-conductive adhesive tape 7. Subsequently, the electrode pads 2 and the metal inner leads 4 are connected by bonding wires 3, respectively.

Figure 3C:
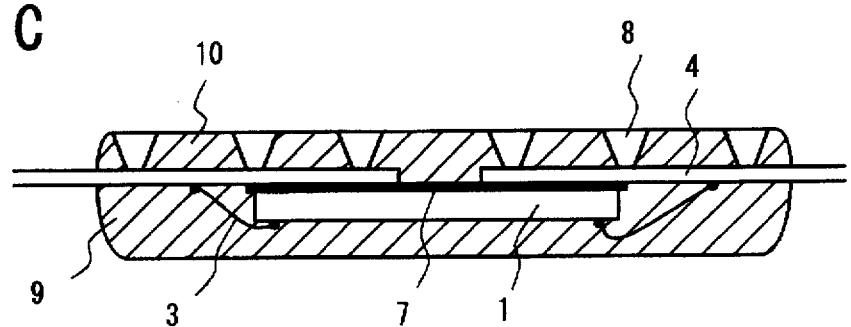

Next, as shown in FIG. 3C, the semiconductor chip 1 and the metal leads 4 are sealed with thermosetting resin such as an epoxy pellet using a low pressure transfer mold method to form the upper seal portion 9 and lower seal portion 10 for the package. Subsequently, the lower seal portion 10 is drilled by a drill or laser beam to form the holes 8 passing through the lower seal portion 10 surface to the metal leads 4. In this case, each hole has an opening adapted to permit a solder ball to be used and preferably has a narrowing wall. Alternatively, a metal mold having protrusions at the positions corresponding to the holes 8 may be used. Even in this case, however, since at least some of the barrier layer of the resin remains on the rear surface of the metal leads 4, use of the drill, the laser beam, or removal by chemical agent is necessary to remove the barrier layer.

Figure 3D:
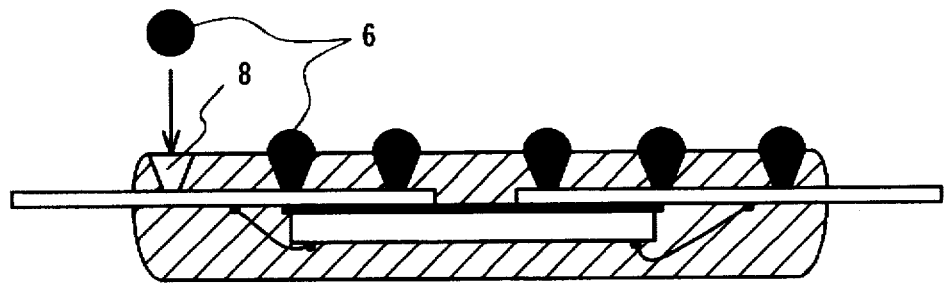

Next, as shown in FIG. 3D, the solder balls 6 are located in the holes 8 and melted to form conductive contacts. Then, the semiconductor chip 1 is heated in a infrared ray reflow furnace such that the solder balls are melted and connected to the inner leads 4. By these contacts, the signal input/output of the semiconductor chip 1 is completed such that each electrode pad 2 is connected to the solder ball 6 via the bonding wire 3, and the metal lead 4.

In the lead frame 5 on which the package with the solder balls 6 is mounted, the inner leads 4 are cut at the position of 1 to 5 mm from the package side wall to form individual semiconductor devices such that the package has protruding lead portions. The protruding lead portions need not be bent. The semiconductor device with the protruding lead portions is mounted on an LSI test apparatus and its electric characteristics are tested using the protruding lead portions. The protruding lead portions are cut at the base, i.e., at the side surface of the semiconductor device package after the test. As a result, the semiconductor device shown in FIG. 2 can be obtained. In this case, if the test is not necessary or the solder balls can be used for the test, the protruding lead portions are unnecessary so they may be cut immediately after the sealing.

As described above, according to the present invention, unlike the conventional ball grid type of semiconductor device, the electrode pad on the semiconductor chip does not to be connected to the solder ball via a resin substrate. In the present invention, since the solder ball is directly connected to the metal lead, a small size of ball grid array type of semiconductor device can be manufactured through a simplified process with a low cost.

What is claimed is:

1. A ball grid type of semiconductor device comprising:
   a plurality of electrically conductive leads;
   a semiconductor chip having a plurality of electrode pads, each of which pads is connected to a corresponding one of said plurality of leads by a respective electrically conductive wire, said semiconductor chip being mounted on said plurality of leads such that said semiconductor chip is electrically isolated from said plurality of leads by an insulating adhesive tape which is interposed between said semiconductor chip and said plurality of leads;
   a package member for packaging said plurality of leads and said semiconductor chip together with said wires, said package member having a plurality of holes, at least one hole of said plurality of holes being provided for a corresponding one of said plurality of leads, said holes extending to said corresponding leads and being arranged in rows extending along respective longitudinal directions of said leads, each of said rows having an identical number of equally spaced apart hole positions with the holes in one row being staggered relative to the holes in an adjacent row; and a solder ball conductively provided for each of said holes.

2. A ball grid type of semiconductor device according to claim 1, wherein said package member comprises a thermosetting resin.

3. A ball grid type of semiconductor device according to claim 1, wherein said plurality of leads are substantially parallel to each other.

4. A ball grid type of semiconductor device according to claim 3, wherein a predetermined spacing is provided between adjacent leads of said plurality of leads.

5. A ball grid type of semiconductor device according to claim 1, wherein said leads are configured into two opposing groups of leads, each of said groups having identical respective numbers of leads, one of said groups of leads extending from one side of said device toward an opposite side of said device, and the other of said groups of leads extending from said opposite side of said device toward said one side thereof, said two groups of leads being separated from each other.

6. A ball grid type of semiconductor device according to claim 5, wherein said rows comprise two different pluralities of rows of equal number, each row of one of said plurality of rows extending along respective longitudinal directions of said one group of leads, and each row of the other of said plurality of rows extending along respective longitudinal directions of said other group of leads.

7. A ball grid type of semiconductor device according to claim 6, wherein said holes are positioned in said rows such that the holes in the one plurality of rows are identically spaced apart from holes in corresponding rows of said other plurality of rows.

8. A ball grid type of semiconductor device comprising:

a semiconductor chip having a plurality of electrode pads;

a plurality of electrically conductive leads on which said semiconductor chip is mounted, wherein each lead of said plurality of leads extends from a peripheral portion of said semiconductor chip substantially obliquely to a central portion of said semiconductor chip wherein a predetermined spacing in a predetermined direction is provided between adjacent leads of said plurality of leads, each of said leads terminating at said central portion of said semiconductor chip, and wherein each of said plurality of electrode pads of said semiconductor chip is connected to a corresponding one of said plurality of leads by a respective electrically conductive wire; and solder balls electrically conductively connected to said plurality of leads.

9. A ball grid of semiconductor device according to claim 8, further comprising a seal member for sealing said plurality of leads and said semiconductor chip together with said wires.

10. A ball grid type of semiconductor device according to claim 9, wherein said seal member comprises a thermosetting resin.

* * * * *